US 11,784,265 B2

(12) United States Patent
Wang et al.

(10) Patent No.: US 11,784,265 B2
(45) Date of Patent: Oct. 10, 2023

(54) MERCURY CADMIUM TELLURIDE-BLACK PHOSPHOROUS VAN DER WAALS HETEROJUNCTION INFRARED POLARIZATION DETECTOR AND PREPARATION METHOD THEREOF

(71) Applicant: Shanghai Institute of Technical Physics Chinese Academy of Sciences, Shanghai (CN)

(72) Inventors: Xudong Wang, Shanghai (CN); Hanxue Jiao, Shanghai (CN); Yan Chen, Shanghai (CN); Jianlu Wang, Shanghai (CN); Xiangjian Meng, Shanghai (CN); Hong Shen, Shanghai (CN); Tie Lin, Shanghai (CN); Junhao Chu, Shanghai (CN)

(73) Assignee: Shanghai Institute of Technical Physics Chinese Academy of Sciences, Shanghai (CN)

( * ) Notice: Subject to any disclaimer, the term of this patent is extended or adjusted under 35 U.S.C. 154(b) by 122 days.

(21) Appl. No.: 17/585,249

(22) Filed: Jan. 26, 2022

(65) Prior Publication Data

US 2022/0238736 A1 Jul. 28, 2022

(30) Foreign Application Priority Data

Jan. 27, 2021 (CN) .......................... 202110107189.4

(51) Int. Cl.
*H01L 31/0336* (2006.01)
*H01L 31/0224* (2006.01)
(Continued)

(52) U.S. Cl.
CPC .... *H01L 31/0336* (2013.01); *H01L 31/02966* (2013.01); *H01L 31/022408* (2013.01); *H01L 31/109* (2013.01); *H01L 31/1832* (2013.01)

(58) Field of Classification Search
CPC ......... H01L 31/0336; H01L 31/022408; H01L 31/02966; H01L 31/109; H01L 31/1832;
(Continued)

(56) References Cited

U.S. PATENT DOCUMENTS 5,696,377 A * 12/1997 Kanzaki .............. H01L 27/1465
257/E27.137
2020/0295075 A1* 9/2020 Goldstein ......... H01L 27/14649

* cited by examiner

*Primary Examiner* — Calvin Y Choi
(74) *Attorney, Agent, or Firm* — James F. Lea, III; Gable Gotwals

(57) ABSTRACT

Disclosed are a mercury cadmium telluride-black phosphorus van der Waals heterojunction infrared polarization detector and a preparation method thereof. The structure of the detector from bottom to top comprises a substrate, a mercury cadmium telluride material, an insulating layer, a two-dimensional semiconductor black phosphorus, and metal electrodes. First, growing the mercury cadmium telluride material on the substrate, removing part of the mercury cadmium telluride by ultraviolet lithography and argon ion etching, filling with aluminum oxide as the insulating layer using an electron beam evaporation method, transferring the two-dimensional semiconductor material black phosphorus at the junction of mercury cadmium telluride and an insulating layer assisted by a polypropylene carbonate film, and preparing the metal source-drain electrodes by electron beam lithography technology combined with the lift-off process to form the mercury cadmium telluride-black phosphorus van der Waals heterojunction infrared polarization detector.

2 Claims, 3 Drawing Sheets

(51) Int. Cl.
*H01L 31/0296* (2006.01)
*H01L 31/109* (2006.01)
*H01L 31/18* (2006.01)

(58) Field of Classification Search
CPC ............... H01L 31/1828; H01L 31/028; H01L 31/0296; H01L 31/1804
See application file for complete search history.

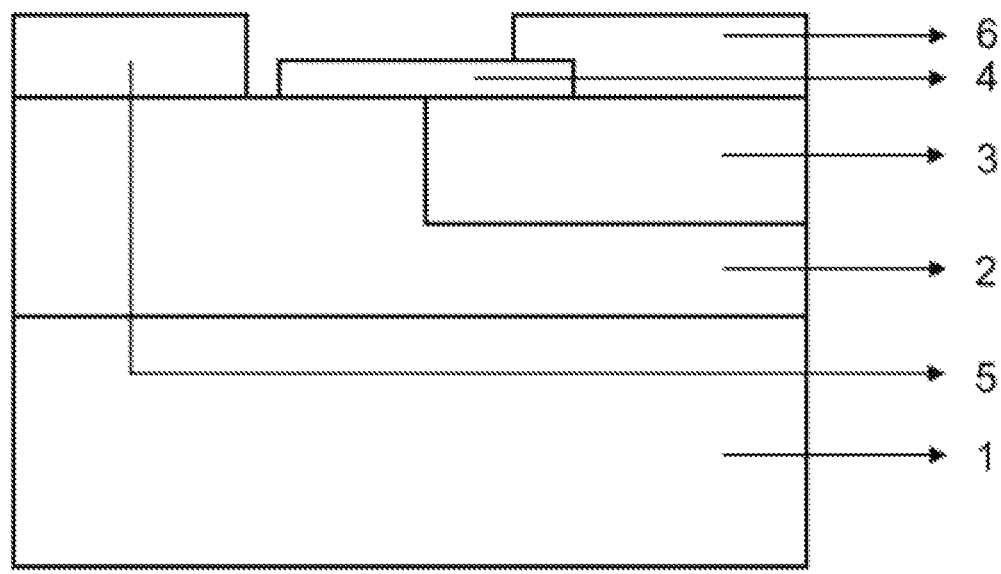
FIG.1
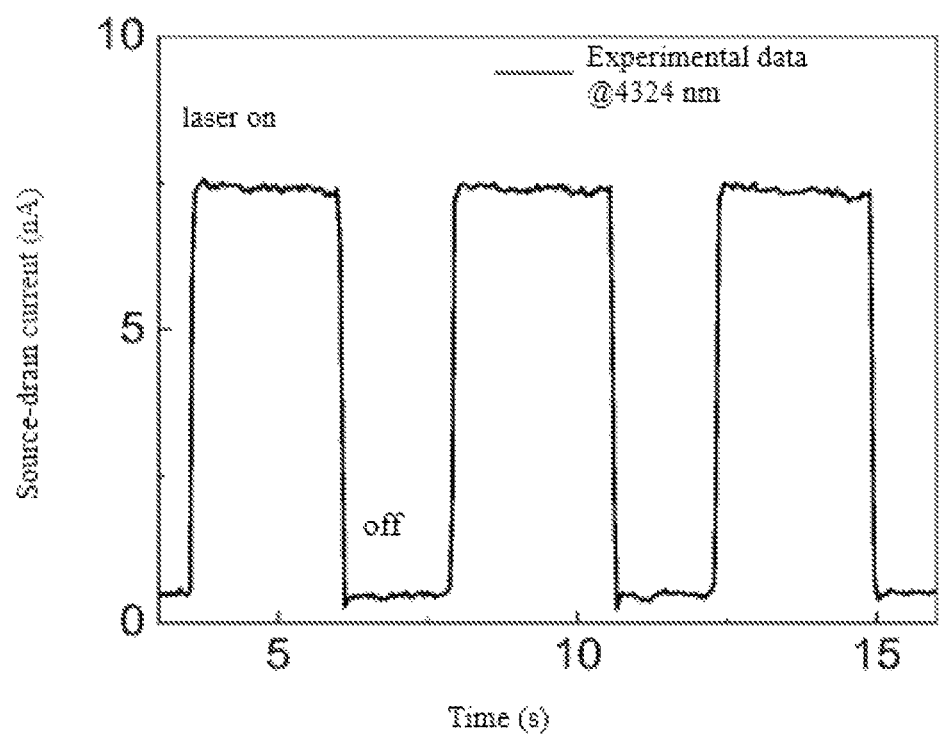
(a)

(b)

(c)

MERCURY CADMIUM TELLURIDE-BLACK PHOSPHOROUS VAN DER WAALS HETEROJUNCTION INFRARED POLARIZATION DETECTOR AND PREPARATION METHOD THEREOF

CROSS REFERENCE TO RELATED APPLICATIONS

This patent application claims the benefit and priority of Chinese Patent Application No. 202110107189.4 filed on Jan. 27, 2021, the disclosure of which is incorporated by reference herein in its entirety as part of the present application.

FIELD OF THE INVENTION

The present disclosure relates to the technical field of infrared detection, in particular to an infrared polarization photodetector, specifically to a mercury cadmium telluride-black phosphorous van der Waals heterojunction device based on a photovoltaic response mechanism and a preparation method thereof.

BACKGROUND OF THE INVENTION

Infrared detectors can convert the received infrared radiation into other physical quantities, such as voltage, current, etc., to facilitate the detection and measurement of infrared radiation energy. Infrared detectors have important and extensive applications in many fields such as military, medicine, biology, and astronomy. Narrow gap semiconductors have the basic characteristics of high optical absorption coefficient, high electron mobility, low heat production rate, etc., and are particularly suitable for preparing high-performance infrared detectors. Among them, the mercury cadmium telluride material system has an adjustable band gap width, which can achieve high-performance infrared response, the response range can cover near infrared to far infrared, so it has become the mainstream material system in the current infrared detection application field. At present, the high-performance infrared detection system has been developed to the third generation, which is characterized by high performance, high resolution, and multi-color detection function. Moreover, it has stronger working ability under high-temperature non-refrigeration conditions, and requires the continuous reduction of device cost and cooling cost. Therefore, the photovoltaic detector based on semiconductor heterojunction still has outstanding advantages in the new generation of infrared detection system.

Currently, devices such as planar junctions, mesa junctions, and ring-hole structures based on the mercury cadmium telluride system have been prepared and applied. Commonly used preparation methods of device include ion implantation to form junction regions and in-situ doping in heteroepitaxial growth followed by mesa etching. Due to the weak mercury-tellurium bond in mercury cadmium telluride, a large amount of lattice damage is often introduced in the process of ion implantation and mesa etching, causing inversion problems and difficulties in the formation of ideal junction regions. As the size of the detector shrinks, material defects have a more prominent impact on device performance, causing performance degradation, device leakage and other problems. At this stage, there are still some difficulties in the preparation of high-quality, large-area mercury cadmium telluride materials in China. Therefore, trying to minimize the material damage caused by device preparation is an important means to reduce the impact on device performance.

Van der Waals heterogeneous integration refers to heterogeneous integration formed by the use of intermolecular forces, which is an emerging means of constructing semiconductor heterojunction structures. The biggest difference from traditional heterojunctions is that there is no chemical bond between the interfaces, which can achieve an atomic level flat interface, avoiding the problems of lattice mismatch, thermal mismatch, and stress mismatch that exist in the preparation process of traditional heterojunctions. It is extremely attractive in constructing damage-free heterogeneous interfaces and helps to show the intrinsic properties of materials. However, low-dimensional semiconductor materials have natural advantages in van der Waals integration due to the combination of van der Waals forces and no dangling bonds between layers. And a variety of two-dimensional materials, such as black phosphorus, germanium selenide, etc., have the characteristics of structural anisotropy and can produce different intensities of responses to polarized light in different directions, so they can be used to achieve polarization detection.

In order to solve the problems of complex preparation process and interface damage of traditional photodetectors, etc., and to realize a new generation of high-performance, multi-functional infrared detectors, the present disclosure proposes a new type of mercury cadmium telluride-black phosphorus van der Waals heterojunction infrared detector based on infrared photoelectric detection technology. Through van der Waals heterogeneous integration, combining the excellent performance of mercury cadmium telluride material and low-dimensional semiconductor material black phosphorus, a medium-wave infrared polarization detector that can work under the condition of no bias voltage is obtained, which can avoid the complex optical structure in the traditional polarization detector, achieve multi-dimensional information acquisition, and has the advantages of low power consumption, rapid response, and simple structure.

SUMMARY OF THE INVENTION

The present disclosure proposes a mercury cadmium telluride-black phosphorus van der Waals heterojunction infrared polarization detector and a preparation method thereof. The detector can realize the infrared polarization detection, which paves the way for the development of a new generation of infrared detectors with high performance, low power consumption and multiple functions.

The present disclosure combines the traditional infrared photoelectric material mercury cadmium telluride and the emerging two-dimensional material black phosphorus to form a van der Waals heterojunction, combining the characteristics and advantages of two different semiconductor materials, and using the infrared absorption characteristics of the two, the medium-wave infrared detection is realized; and using the anisotropy of the two-dimensional semiconductor material black phosphorous, the medium-infrared polarization detection is realized. The detector works based on the photovoltaic response mechanism, which can realize infrared polarization detection without an external bias voltage, and has the advantages of low power consumption, high sensitivity, and rapid response.

The present disclosure provides a mercury cadmium telluride-black phosphorus van der Waals heterojunction infrared polarization detector, wherein the structure from bottom to top comprises:

A substrate 1,

A mercury cadmium telluride material 2,

An insulating layer 3 partially covering the mercury cadmium telluride material 2, A two-dimensional semiconductor material 4 covering the mercury cadmium telluride material 2 and the insulating layer 3, A metal electrode 5 on the mercury cadmium telluride material side contacting the mercury cadmium telluride material 2, A metal electrode 6 on the two-dimensional material side contacting the insulating layer 3 and the two-dimensional semiconductor material 4, Wherein, the substrate 1 is an intrinsic germanium substrate with a thickness of 0.9 mm;

Wherein, the mercury cadmium telluride material 2 is mercury cadmium telluride with a cut-off wavelength of 4.35 µm and a thickness of 8 µm;

Wherein, the insulating layer 3 is aluminum oxide with a thickness of 100-150 nm;

Wherein, the two-dimensional semiconductor material 4 is black phosphorus with a thickness of 50-150 nm;

Wherein, the metal electrode 5 on the mercury cadmium telluride material side and the metal electrode 6 on the two-dimensional material side are titanium/gold electrodes, the thickness of titanium is 10-15 nm, and the thickness of gold is 35-45 nm.

The present disclosure provides a mercury cadmium telluride-black phosphorus van der Waals heterojunction infrared polarization detector and a preparation method thereof, wherein the method comprises the following steps:

1) Growth of Mercury Cadmium Telluride Material

Preparing the mercury cadmium telluride material on an intrinsic germanium substrate by molecular beam epitaxy with a thickness of 8 µm;

2) Preparation of Insulating Layer

Forming a mask on the mercury cadmium telluride material by ultraviolet lithography to expose part of the mercury cadmium telluride material, removing the mercury cadmium telluride material with a thickness of 100-150 nm by argon ion etching, filling with aluminum oxide with a thickness of 100-150 nm by electron beam evaporation, and removing the mask using acetone soaking;

3) Preparation and Transfer of Two-Dimensional Semiconductor Materials

Using a mechanical exfoliation method to obtain the two-dimensional semiconductor material black phosphorus with a thickness of 50-150 nm, transferring the two-dimensional semiconductor material to a silicon substrate, covering the two-dimensional semiconductor with a polypropylene carbonate film, heating to make the polypropylene carbonate full contact with the two-dimensional semiconductor material, removing the polypropylene carbonate film from the substrate after cooling, in which the two-dimensional semiconductor material is adsorbed, moving the film under a microscope to align the two-dimensional semiconductor material with the junction of mercury cadmium telluride and aluminum oxide, heating to make contact slowly, after cooling down, soaking the sample in acetone to completely dissolve the polypropylene carbonate to obtain a mercury cadmium telluride-black phosphorus van der Waals heterojunction;

4) Preparation of Metal Electrodes:

Using electron beam lithography technology, combined with electron beam evaporation of metal and lift-off process to prepare the metal electrode 5 on the mercury cadmium telluride side and the metal electrode 6 on the two-dimensional semiconductor material side, the electrodes are titanium/gold, the thickness of titanium is 10-15 nm, and the thickness of gold is 35-45 nm.

The present disclosure has the following advantages: (1) By combining the traditional infrared photoelectric material mercury cadmium telluride and the emerging two-dimensional material black phosphorus to form a van der Waals heterojunction, the device works based on the photovoltaic effect and can realize the medium-wave infrared detection without an external bias voltage, and the device has the advantages of low power consumption, high sensitivity, and fast response speed; (2) Using the anisotropy of the two-dimensional semiconductor material black phosphorous to realize the medium-wave infrared polarization detection without additional optical structure, avoiding the complicated optical structure of the traditional polarization detector, and having the advantages of simple structure and easy preparation; (3) Since the two-dimensional material has an atomic level flat surface without dangling bonds, and the heterojunction interface relies on van der Waals force during the device preparation process, there is no damage to the heterojunction interface, and a nearly perfect heterojunction interface can be obtained, which avoids the damage to the interface in the traditional ion implantation process.

BRIEF DESCRIPTION OF THE DRAWINGS

FIG. 1 is a schematic cross-sectional view of the structure of a mercury cadmium telluride-black phosphorus van der Waals heterojunction infrared polarization detector. In the picture: 1 substrate, 2 mercury cadmium telluride material, 3 insulating layer, 4 two-dimensional semiconductor material, 5 metal electrode, 6 metal electrode.

FIG. 2(b) shows the photoresponse characteristics of a mercury cadmium telluride-black phosphorus van der Waals heterojunction infrared polarization detector to a medium-wave infrared laser with a wavelength of 4135 nm under the condition of zero bias voltage; FIG. 2(c) shows the photoresponse characteristics of a mercury cadmium telluride-black phosphorus van der Waals heterojunction infrared polarization detector to a medium-wave infrared laser with a wavelength of 4034 nm under the condition of zero bias voltage;

DETAILED DESCRIPTION OF THE PREFERRED EMBODIMENTS

Example 1

Figure 2:
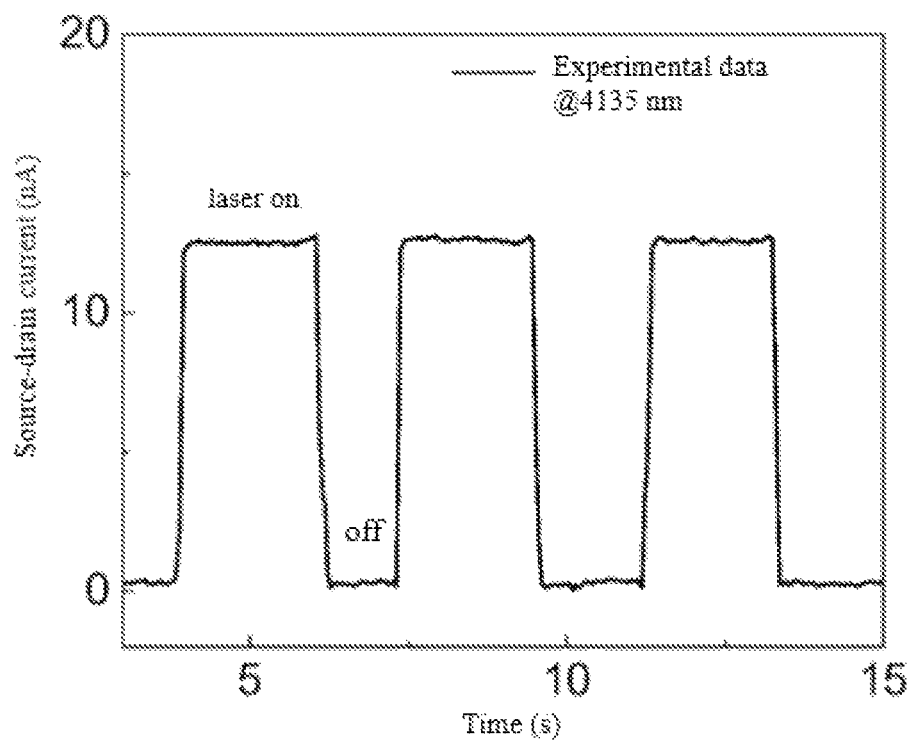
FIG. 2 shows the photoresponse characteristics of a mercury cadmium telluride-black phosphorus van der Waals heterojunction infrared polarization detector; Wherein, FIG. 2 (a) shows the photoresponse characteristics of a mercury cadmium telluride-black phosphorus van der Waals heterojunction infrared polarization detector to a medium-wave infrared laser with a wavelength of 4324 nm under the condition of zero bias voltage.
Figure 2:
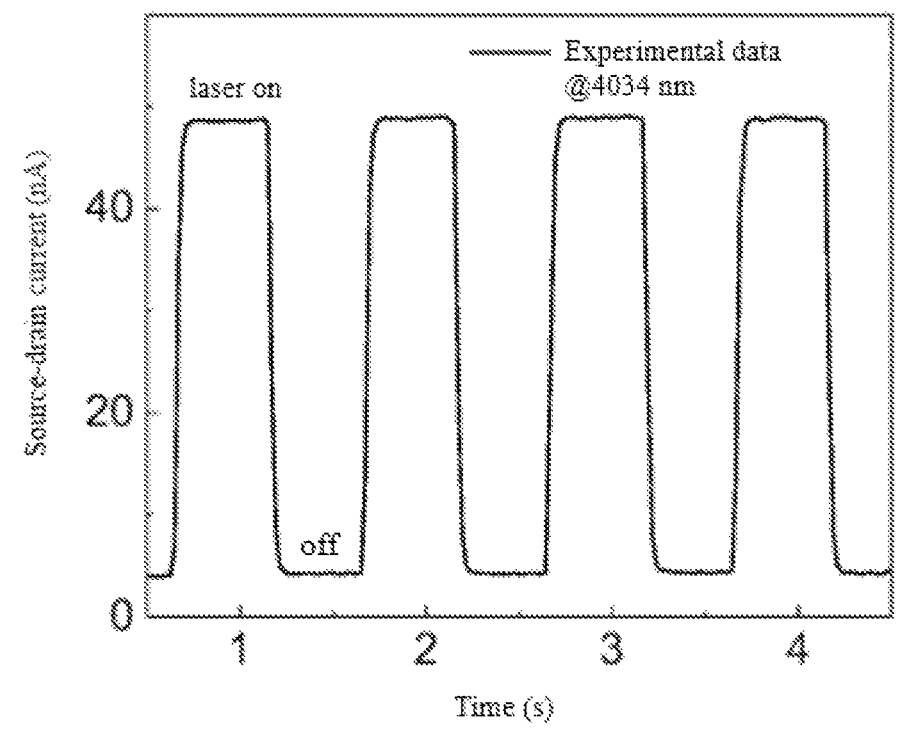
Figure 3:
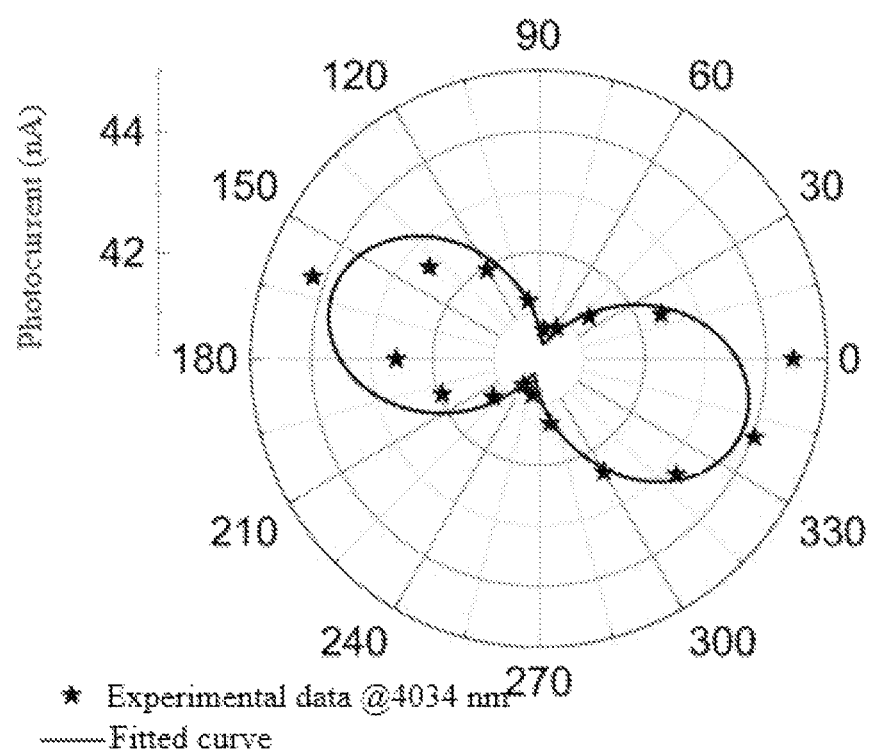
FIG. 3 shows the relationship between the photocurrent generated by a mercury cadmium telluride-black phosphorus van der Waals heterojunction infrared polarization detector under the illumination of a laser with a wavelength of 4034 nm and the polarization angle of the incident light.

The Example 1 of the present disclosure will be described in detail below with reference to the accompanying drawings:

The present disclosure develops a black phosphorus-mercury cadmium telluride mixed dimensional heterojunction infrared detector. By combining the traditional infrared photoelectric material mercury cadmium telluride and the emerging two-dimensional material black phosphorus to form a van der Waals heterojunction, using the polarization absorption characteristics of black phosphorus and the infrared absorption characteristics of the two, and combining the characteristics and advantages of the two, an infrared photodetector with polarization detection function is obtained.

Specific steps are as follows:

1. Substrate Selection

Intrinsic germanium with a thickness of 0.9 mm was selected as the substrate.

2. Preparation of Mercury Cadmium Telluride Material

A mercury cadmium telluride material with a thickness of 8 μm was prepared on the surface of the germanium substrate by molecular beam epitaxy.

3. Preparation of Insulating Layer

A mask was formed on the mercury cadmium telluride material by photolithography, the mercury cadmium telluride with a thickness of 150 nm was removed by argon ion etching, and aluminum oxide with a thickness of 150 nm was evaporated by an electron beam evaporation method.

4. Preparation and Transfer of Two-Dimensional Semiconductor Materials

A two-dimensional semiconductor material black phosphorus with a thickness of 100 nm was prepared by a mechanical exfoliation method, and transferred to a silicon substrate. The two-dimensional semiconductor material was covered with a layer of polypropylene carbonate film, heated to fully contact with the two-dimensional semiconductor material, and the polypropylene carbonate film was removed from the substrate after cooling down. At this time, the two-dimensional semiconductor material was adsorbed by the polypropylene carbonate. The film was moved under the microscope to make the two-dimensional semiconductor material align with the junction of mercury cadmium telluride and aluminum oxide, and heated to make contact slowly; after cooling down, the sample was soaked in acetone to completely dissolve the polypropylene carbonate. So far, the mercury cadmium telluride-black phosphorus van der Waals heterojunction was prepared.

5. Preparation of Metal Electrode

Metal electrode patterns were prepared by electron beam lithography; metal electrodes with 15 nm of titanium and 45 nm of gold were prepared by electron beam evaporation technology; combined with a lift-off method, the metal film was removed to obtain the metal electrodes. The final structure of the device is shown in FIG. 1.

6. Infrared Photoelectric Performance Test

Under the condition that the bias voltage of the device was zero, the device was irradiated with a medium-wave infrared laser with a wavelength of 4324 nm, the change of the current of the device with time was tested, and the experimental results are shown in FIG. 2(a). It can be seen that when the bias voltage is zero, the current changes rapidly and obviously as the laser is turned on and off. The device exhibits a sensitive light response to the laser with a wavelength of 4324 nm, indicating that the developed black phosphorus-mercury cadmium telluride heterojunction device can realize medium-wave infrared detection, and the device can work under zero bias conditions without external voltage, thus effectively reducing the power consumption of the detector.

Example 2

The Example 2 of the present disclosure will be described in detail below with reference to the accompanying drawings:

The present disclosure develops a black phosphorus-mercury cadmium telluride mixed dimensional heterojunction infrared detector. By combining the traditional infrared photoelectric material mercury cadmium telluride and the emerging two-dimensional material black phosphorus to form a van der Waals heterojunction, using the polarization absorption characteristics of black phosphorus and the infrared absorption characteristics of the two, and combining the characteristics and advantages of the two, an infrared photodetector with polarization detection function is obtained.

Specific steps are as follows:

1. Substrate Selection

Intrinsic germanium with a thickness of 0.9 mm was selected as the substrate.

2. Preparation of Mercury Cadmium Telluride Material

A mercury cadmium telluride material with a thickness of 8 μm was prepared on the surface of the germanium substrate by molecular beam epitaxy.

3. Preparation of Insulating Layer

A mask was formed on the mercury cadmium telluride material by photolithography, the mercury cadmium telluride with a thickness of 120 nm was removed by argon ion etching, and aluminum oxide with a thickness of 120 nm was evaporated by an electron beam evaporation method.

4. Preparation and Transfer of Two-Dimensional Semiconductor Materials

A two-dimensional semiconductor material black phosphorus with a thickness of 50 nm was prepared by a mechanical exfoliation method, and transferred to a silicon substrate. The two-dimensional semiconductor material was covered with a layer of polypropylene carbonate film, heated to fully contact with the two-dimensional semiconductor material, and the polypropylene carbonate film was removed from the substrate after cooling down. At this time, the two-dimensional semiconductor material was adsorbed by the polypropylene carbonate. The film was moved under the microscope to make the two-dimensional semiconductor material align with the junction of mercury cadmium telluride and aluminum oxide, and heated to make contact slowly; after cooling down, the sample was soaked in acetone to completely dissolve the polypropylene carbonate. So far, the mercury cadmium telluride-black phosphorus van der Waals heterojunction was prepared.

5. Preparation of Metal Electrode

Metal electrode patterns were prepared by electron beam lithography; metal electrodes with 10 nm of titanium and 35 nm of gold were prepared by electron beam evaporation technology; combined with a lift-off method, the metal film was removed to obtain the metal electrodes. The final structure of the device is shown in FIG. 1.

6. Infrared Photoelectric Performance Test

Under the condition that the bias voltage of the device was zero, the device was irradiated with a medium-wave infrared laser with a wavelength of 4135 nm, the change of the current of the device with time was tested, and the experimental results are shown in FIG. 2(b). It can be seen that when the bias voltage is zero, the current changes rapidly and obviously as the laser is turned on and off. The device exhibits a sensitive light response to the laser with a wavelength of 4135 nm, indicating that the developed black phosphorus-mercury cadmium telluride heterojunction device can realize medium-wave infrared detection, and the device can work under zero bias conditions without external voltage, thus effectively reducing the power consumption of the detector.

Example 3

The Example 3 of the present disclosure will be described in detail below with reference to the accompanying drawings:

The present disclosure develops a black phosphorus-mercury cadmium telluride mixed dimensional heterojunction infrared detector. By combining the traditional infrared photoelectric material mercury cadmium telluride and the emerging two-dimensional material black phosphorus to form a van der Waals heterojunction, using the polarization absorption characteristics of black phosphorus and the infrared absorption characteristics of the two, and combining the characteristics and advantages of the two, an infrared photodetector with polarization detection function is obtained.

Specific steps are as follows:

1. Substrate Selection

Intrinsic germanium with a thickness of 0.9 mm was selected as the substrate.

2. Preparation of Mercury Cadmium Telluride Material

A mercury cadmium telluride material with a thickness of 8 μm was prepared on the surface of the germanium substrate by molecular beam epitaxy.

3. Preparation of Insulating Layer

A mask was formed on the mercury cadmium telluride material by photolithography, the mercury cadmium telluride with a thickness of 100 nm was removed by argon ion etching, and aluminum oxide with a thickness of 100 nm was evaporated by an electron beam evaporation method.

4. Preparation and Transfer of Two-Dimensional Semiconductor Materials

A two-dimensional semiconductor material black phosphorus with a thickness of 150 nm was prepared by a mechanical exfoliation method, and transferred to a silicon substrate. The two-dimensional semiconductor material was covered with a layer of polypropylene carbonate film, heated to fully contact with the two-dimensional semiconductor material, and the polypropylene carbonate film was removed from the substrate after cooling down. At this time, the two-dimensional semiconductor material was adsorbed by the polypropylene carbonate. The film was moved under the microscope to make the two-dimensional semiconductor material align with the junction of mercury cadmium telluride and aluminum oxide, and heated to make contact slowly; after cooling down, the sample was soaked in acetone to completely dissolve the polypropylene carbonate. So far, the mercury cadmium telluride-black phosphorus van der Waals heterojunction was prepared.

5. Preparation of Metal Electrode

Metal electrode patterns were prepared by electron beam lithography; metal electrodes with 12 nm of titanium and 40 nm of gold were prepared by electron beam evaporation technology; combined with a lift-off method, the metal film was removed to obtain metal electrodes. The final structure of the device is shown in FIG. 1.

6. Infrared Photoelectric Performance Test

Under the condition that the bias voltage of the device was zero, the device was irradiated with a medium-wave infrared laser with a frequency of 1 Hz and a wavelength of 4034 nm, the change of the current of the device with time was tested, and the experimental results are shown in FIG. 2(*c*). It can be seen that when the bias voltage is zero, the current changes rapidly and obviously as the laser is turned on and off. The device exhibits a sensitive light response to the laser with a wavelength of 4034 nm, indicating that the developed black phosphorus-mercury cadmium telluride heterojunction device can realize medium-wave infrared detection, and the device can work under zero bias conditions without external voltage, thus effectively reducing the power consumption of the detector.

The above descriptions are only preferred embodiments of the present disclosure and are not intended to limit the present disclosure. For those skilled in the art, the present disclosure may have various modifications and changes. Any modification, replacement, improvement, etc. made within the thought and principle of the present disclosure are all included in the protection scope of the present disclosure.

It is to be understood that the terms "including", "comprising", "consisting" and grammatical variants thereof do not preclude the addition of one or more components, features, steps, or integers or groups thereof and that the terms are to be construed as specifying components, features, steps or integers.

If the specification or claims refer to "an additional" element, that does not preclude there being more than one of the additional element.

It is to be understood that where the claims or specification refer to "a" or "an" element, such reference is not be construed that there is only one of that element.

It is to be understood that where the specification states that a component, feature, structure, or characteristic "may", "might", "can" or "could" be included, that particular component, feature, structure, or characteristic is not required to be included.

Where applicable, although state diagrams, flow diagrams or both may be used to describe embodiments, the invention is not limited to those diagrams or to the corresponding descriptions. For example, flow need not move through each illustrated box or state, or in exactly the same order as illustrated and described.

Methods of the present invention may be implemented by performing or completing manually, automatically, or a combination thereof, selected steps or tasks.

The term "method" may refer to manners, means, techniques and procedures for accomplishing a given task including, but not limited to, those manners, means, techniques and procedures either known to, or readily developed from known manners, means, techniques and procedures by practitioners of the art to which the invention belongs.

The term "at least" followed by a number is used herein to denote the start of a range beginning with that number (which may be a ranger having an upper limit or no upper limit, depending on the variable being defined). For example, "at least 1" means 1 or more than 1. The term "at most" followed by a number is used herein to denote the end of a range ending with that number (which may be a range having 1 or 0 as its lower limit, or a range having no lower limit, depending upon the variable being defined). For example, "at most 4" means 4 or less than 4, and "at most 40%" means 40% or less than 40%.

When, in this document, a range is given as "(a first number) to (a second number)" or "(a first number)-(a second number)", this means a range whose lower limit is the first number and whose upper limit is the second number. For example, 25 to 100 should be interpreted to mean a range whose lower limit is 25 and whose upper limit is 100. Additionally, it should be noted that where a range is given, every possible subrange or interval within that range is also specifically intended unless the context indicates to the contrary. For example, if the specification indicates a range of 25 to 100 such range is also intended to include subranges such as 26-100, 27-100, etc., 25-99, 25-98, etc., as well as any other possible combination of lower and upper values within the stated range, e.g., 33-47, 60-97, 41-45, 28-96, etc. Note that integer range values have been used in this paragraph for purposes of illustration only and decimal and fractional values (e.g., 46.7-91.3) should also be understood to be intended as possible subrange endpoints unless specifically excluded.

It should be noted that where reference is made herein to a method comprising two or more defined steps, the defined steps can be carried out in any order or simultaneously (except where context excludes that possibility), and the method can also include one or more other steps which are carried out before any of the defined steps, between two of the defined steps, or after all of the defined steps (except where context excludes that possibility).

Further, it should be noted that terms of approximation (e.g., "about", "substantially", "approximately", etc.) are to be interpreted according to their ordinary and customary meanings as used in the associated art unless indicated otherwise herein. Absent a specific definition within this disclosure, and absent ordinary and customary usage in the associated art, such terms should be interpreted to be plus or minus 10% of the base value.

Thus, the present invention is well adapted to carry out the objects and attain the ends and advantages mentioned above as well as those inherent therein. While the inventive device has been described and illustrated herein by reference to certain preferred embodiments in relation to the drawings attached thereto, various changes and further modifications, apart from those shown or suggested herein, may be made therein by those of ordinary skill in the art, without departing from the spirit of the inventive concept the scope of which is to be determined by the following claims.

What is claimed is:

1. A mercury cadmium telluride-black phosphorus van der Waals heterojunction infrared polarization detector, wherein the structure from bottom to top comprises:

A substrate (1), a mercury cadmium telluride material (2), an insulating layer (3), a two-dimensional semiconductor material (4) covering the mercury cadmium telluride material (2) and the insulating layer (3), a metal electrode (5) on the mercury cadmium telluride material side contacting the mercury cadmium telluride material (2), and a metal electrode (6) on the two-dimensional semiconductor material side contacting the insulating layer (3) and the two-dimensional semiconductor material (4), the insulating layer (3) covers a removed part of the mercury cadmium telluride material (2) with a thickness the same as that of the removed mercury cadmium telluride material (2); wherein, The substrate (1) is an intrinsic germanium substrate with a thickness of 0.9 mm;

The mercury cadmium telluride material (2) is mercury cadmium telluride with a cut-off wavelength of 4.3 μm and a thickness of 8 μm;

The insulating layer (3) is aluminum oxide with a thickness of 100-150 nm;

The two-dimensional semiconductor material (4) is black phosphorus with a thickness of 50-150 nm;

The metal electrode (5) on the mercury cadmium telluride material side and the metal electrode (6) on the two-dimensional semiconductor material side are double-layer electrodes of titanium and gold, the thickness of the lower layer of titanium is 10-15 nm, and the thickness of the upper layer of gold is 35-45 nm.

2. A method for preparing a mercury cadmium telluride-black phosphorus van der Waals heterojunction infrared polarization detector according to claim 1 wherein comprising the following steps:

1) Preparing the mercury cadmium telluride material (2) on the substrate (1) by molecular beam epitaxy, 2) Forming a mask on the mercury cadmium telluride material (2) by ultraviolet lithography, removing a certain thickness of the mercury cadmium telluride material by argon ion etching, filling the insulating layer (3) by electron beam evaporation, and removing the mask using acetone soaking;

3) Using a mechanical exfoliation method to obtain the two-dimensional semiconductor material (4), transferring the two-dimensional semiconductor material to a silicon substrate, covering the two-dimensional semiconductor material with a polypropylene carbonate film, heating to make the polypropylene carbonate full contact with the two-dimensional semiconductor material removing the polypropylene carbonate film from the silicon substrate after cooling, in which the two-dimensional semiconductor material is adsorbed, moving the film under a microscope to align the two-dimensional semiconductor material with the junction of the mercury cadmium telluride material and aluminum oxide, heating to make contact slowly, after cooling down, soaking the sample in acetone to completely dissolve the polypropylene carbonate to obtain a mercury cadmium telluride-black phosphorus van der Waals heterojunction;

4) Preparing metal electrodes using electron beam lithography technology, combined with electron beam evaporation of metal and lift-off process to prepare the metal electrode (5) on the mercury cadmium telluride side and the metal electrode (6) on the two-dimensional semiconductor material side, the electrode material are titanium and gold, the thickness of titanium is 10-15 nm, and the thickness of gold is 35-45 nm, thereby finishing the preparation of the mercury cadmium telluride-black phosphorus van der Waa s heterojunction infrared polarization detector.

* * * * *